United States Patent
Yamagami et al.

(10) Patent No.: US 10,086,472 B2
(45) Date of Patent: Oct. 2, 2018

(54) LASER MACHINING METHOD

(71) Applicant: Via Mechanics, Ltd., Ebina-shi, Kanagawa (JP)

(72) Inventors: Kentaro Yamagami, Atsugi (JP); Tatsuya Nishibe, Machida (JP); Takashi Sasaki, Zama (JP)

(73) Assignee: Via Mechanics, Ltd., Ebina-shi (JP)

(*) Notice: Subject to any disclaimer, the term of this patent is extended or adjusted under 35 U.S.C. 154(b) by 555 days.

(21) Appl. No.: 14/262,055

(22) Filed: Apr. 25, 2014

(65) Prior Publication Data

US 2014/0319107 A1   Oct. 30, 2014

(30) Foreign Application Priority Data

Apr. 26, 2013   (JP) .................................. 2013-094230
Mar. 11, 2014   (JP) .................................. 2014-047205

(51) Int. Cl.
*B23K 26/08*   (2014.01)
*B23K 26/38*   (2014.01)
(Continued)

(52) U.S. Cl.
CPC ...... *B23K 26/0853* (2013.01); *B23K 26/0622* (2015.10); *B23K 26/364* (2015.10);
(Continued)

(58) Field of Classification Search
CPC ............ B23K 26/0853; B23K 26/0622; B23K 26/0624; B23K 26/0626; B23K 26/03; B23K 26/362
(Continued)

(56) References Cited

U.S. PATENT DOCUMENTS 3,710,798 A * 1/1973 Bredemeier ........... A61B 18/20
                                                    219/121.6
7,817,685 B2   10/2010 Osako et al.
(Continued)

FOREIGN PATENT DOCUMENTS

CN            101342636      *  1/2009   ............. B23K 26/00
JP         H 3-238184 A       10/1991
(Continued)

*Primary Examiner* — Alexander Valvis
*Assistant Examiner* — Christopher R Dandridge
(74) *Attorney, Agent, or Firm* — Crowell & Moring LLP (57) ABSTRACT

A laser machining method for cutting or cutting grooves on a workpiece using an apparatus having an X-Y table for mounting the workpiece, a laser source emitting a continuous wave or a quasi-continuous wave laser beam, modulator forming a pulsed laser beam by a high-speed modulation of the continuous wave or quasi-continuous wave laser beam, and an optical system capable of converging the pulsed laser beam on the workpiece, wherein the method comprising cutting with the pulsed laser beams along a locus including a portion where the moving speed of the X-Y table is decreased, and the pitch of holes machined with said laser pulses is kept constant by adjusting the intervals between successive said laser pulses in accordance with the moving speed of said workpiece, the method further comprising increasing the pulse widths of the laser pulses in accordance with the decrease in moving speed of the X-Y table in the portion where the moving speed of the X-Y table is decreased.

1 Claim, 9 Drawing Sheets (51) Int. Cl.
  *B23K 26/0622* (2014.01)
  *B23K 26/364* (2014.01)
  *H05K 3/00* (2006.01)
  *B23K 103/00* (2006.01)
(52) U.S. Cl.
  CPC .......... *B23K 26/38* (2013.01); *B23K 2203/42* (2015.10); *B23K 2203/50* (2015.10); *H05K 3/0026* (2013.01)
(58) Field of Classification Search
  USPC ............. 219/121.61, 121.62, 121.68, 121.69
  See application file for complete search history.

(56) References Cited

U.S. PATENT DOCUMENTS

| | | | |
|---|---|---|---|
| 8,208,506 B2 | 6/2012 | Osako et al. | |
| 2007/0228023 A1* | 10/2007 | Kleine | B23K 26/0626 219/121.67 |
| 2008/0311299 A1* | 12/2008 | Furukawa | B41J 3/44 427/261 |
| 2010/0264123 A1* | 10/2010 | Jennings | B23K 26/0066 219/121.76 |
| 2012/0111841 A1* | 5/2012 | Murison | B23K 26/0622 219/121.71 |

FOREIGN PATENT DOCUMENTS

| | | |
|---|---|---|
| JP | 2006-101764 A | 4/2006 |
| JP | 2013-63469 A | 4/2013 |

* cited by examiner

LASER MACHINING METHOD

CROSS-REFERENCE TO RELATED APPLICATION

This application claims priority from Japanese Patent Applications No. 2013-94230 filed with the Japan Patent Office on Apr. 26, 2013 and No. 2014-047205 filed with the Japan Patent Office on Mar. 11, 2014, the entire contents of which are hereby incorporated by reference.

BACKGROUND

1. Technical Field

The present invention relates to a laser machining method for cutting an unnecessary part of a resin sheet adhering to a substrate.

2. Related Art

In recent years, printed wiring hoards or glass substrates having circuits disposed thereon (hereinafter generally referred to as substrate(s)) have been covered with adhesive resin films for protecting the substrates from damage and/or contamination.

Figure 7:
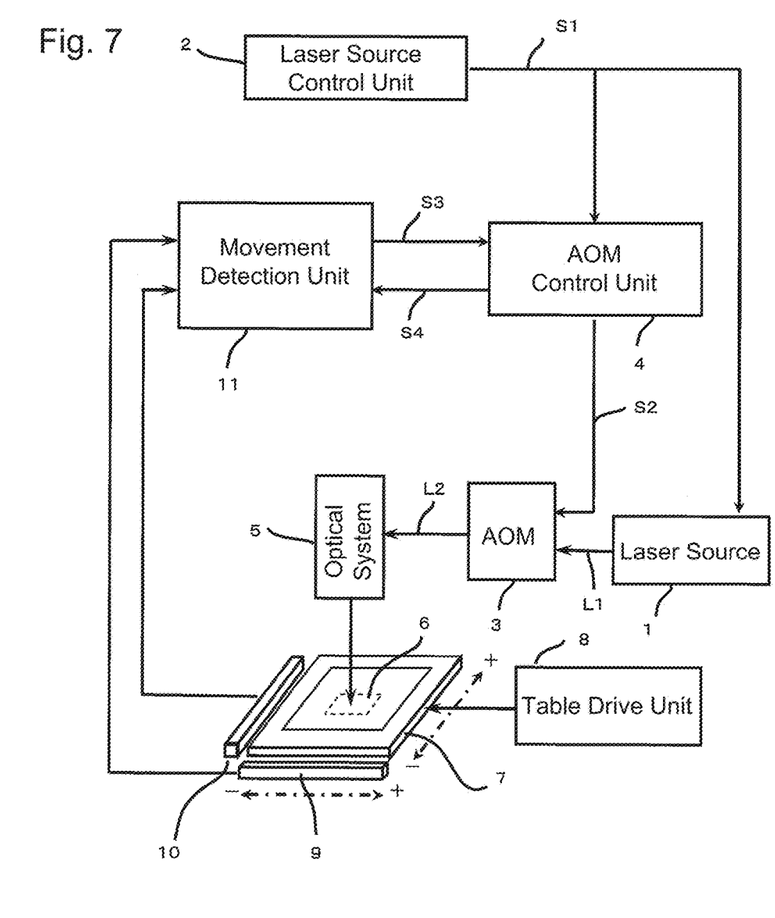
FIG. 7 is a schematic diagram of a machining apparatus related to the present invention.
Figure 8:
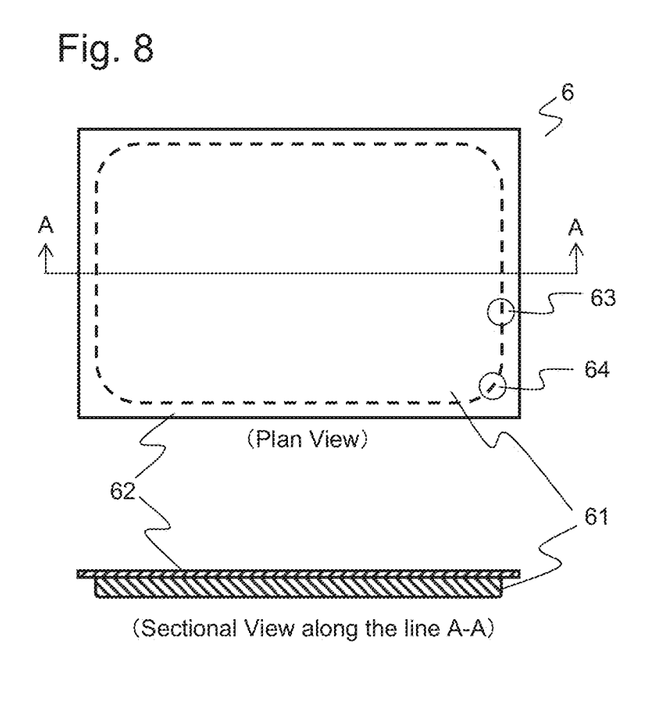
FIG. 8 is a schematic diagram of a workpiece related to the present invention.

The resin film used is slightly larger than the substrate, and the part of the resin film that extends beyond the sides of the substrate is cut by a laser machining apparatus as illustrated in FIG. 7. A workpiece 6 is a substrate 61 having a resin film 62 adhered thereto as illustrated in FIG. 8. The resin film is cut along the outline of the substrate 61. The workpiece 6 is mounted and secured on an X-Y table 7. Therefore, the workpiece 6 is moved with the X-Y table 7 which is driven by a table driving unit. Here, the speed of the X-Y table 7 is detected by using an X-axis scale 9 and a Y-axis scale 10. A laser source control unit 2 controls a laser source 1 and also an AOM control unit 4 for an acousto-optic modulator 3 (hereinafter referred to as AOM) by feeding a signal S1. The AOM control unit 4 controls the AOM 3 by communicating (S3, S4) with a movement detection unit 11 for detecting a predetermined amount of movement. Upon the reception of the signal S1 from the laser source control unit 2, the laser source 1, which is a continuous wave (CW) carbon dioxide laser, emits a continuous wave (CW) laser beam L1. The CW laser beam L1 is modulated into a pulsed beam L2 using the AOM 3 as a high-speed chopper, and then is converged on the workpiece 6 through an optical system 5. With this beam, the resin film 62 is cut by relative movement between the laser beam L2 and the workpiece 6. These laser source control unit 2 and table drive unit 8 are controlled by a control unit (not shown) storing a machining program.

In such machining, it is well known the laser pulses can be stabilized by slicing a continuous wave laser beam or a quasi-continuous wave laser beam using an AOM, as described in the paragraph [0010] of JP-A-2006-101764 and the paragraph [0035] of JP-A-2013-063169, for example. Where, the quasi-continuous wave laser beam (hereinafter also referred to as "quasi-CW laser beam") is obtained by increasing the duration of pulsed radiofrequency (RE) discharge for laser oscillation to 80% or more.

It is also known that the pitch of holes machined with the laser pulse spots is controlled by adjusting the intervals between successive laser pulses (hereinafter referred to as "laser pulse interval(s)" or simply "pulse interval(s)") in accordance with the moving speed of the workpiece as described in the paragraph [0009] of JP-A-200-101764.

In the case of cutting the resin film 62 along the outline of the substrate 61 having corners (arcuated portions) 64 and straight lines as illustrated in FIG. 8, the speed of machining is high and constant along the straight lines 63, (herein after referred to as High Speed period) and decreased by deceleration just before the corners 64 (herein after referred to as Decelerating period) and is low and constant along the corners 64 (herein after referred to as Low Speed period); then, after the corners 64, the speed is increased by acceleration (herein after referred to as Accelerating period) to return to its constant value from the initial High Speed period.

Figure 9A:
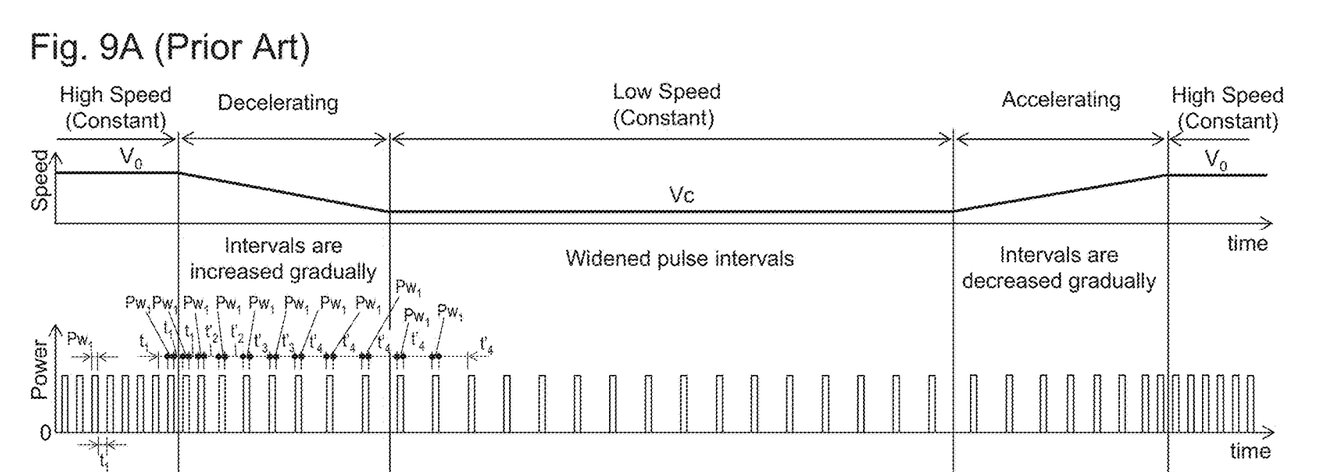
FIG. 9A is a conceptual timing diagram showing a relationship between a conventional laser pulse train (in the lower part) and a speed change of the X-Y table (in the upper part)
Figure 9B:
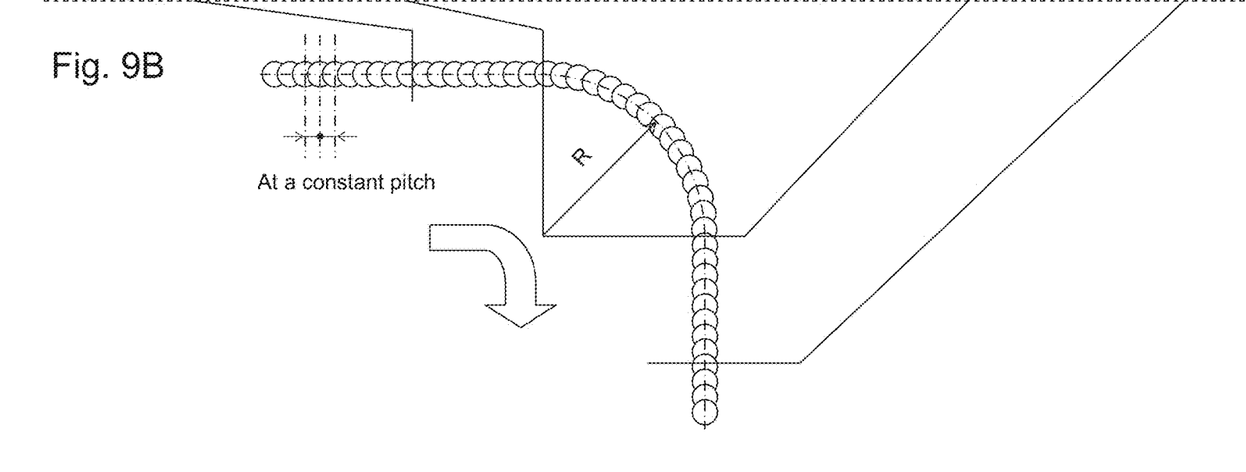
FIG. 9B is a schematic diagram of the a locus of laser spots in accordance with the laser pulses in the laser pulse train described in FIG. 9A.

FIG. 9A (on the upper side) is a conceptual timing diagram show relationship between a conventional laser pulse train and a speed change of the X-Y table. FIG. 9B (on the lower side) is a schematic diagram of a locus of laser spots in accordance with the laser pulses described in FIG. 9A. The pulse intervals are gradually increased, such as $t_1'<t_2'<t_3'<t_4'$ in FIG. 9A, when the speed of the X-Y table is decreased (Decelerating period), and is adjusted to an interval in accordance with a low speed in the Low Speed period (corner 64). On the contrary, when the speed of the X-Y table is increased (Accelerating period), the pulse intervals are gradually decreased in reverse order to the Decelerating period, and then returns to the pulse interval in the High Speed period. As described above, the intervals along the locus of the laser spots is kept constant.

In the machining as described above, the straight lines 63 are cut without any problem. The machining may be insufficient, however, in the corners 64 (including just before and just after) where the speed of the X-Y table has to be decreased.

An object of the present invention is to solve the problem in machining the portion where the speed of the X-Y table has to be decreased.

SUMMARY

A laser machining method for cutting or cutting grooves on a workpiece using an apparatus having an X-Y table movable in X and Y directions for mounting the workpiece, a laser source emitting a continuous wave or quasi-continuous wave laser beam, a modulator forming a pulsed laser beam by a high-speed modulation of the continuous wave or quasi-continuous wave laser beam emitted from the laser source, and an optical system capable of converging the pulsed laser beam on the workpiece, wherein the method comprising: cutting with the pulsed laser beam along a locus including a portion where the moving speed of the X-Y table is decreased and the pitch of holes machined with said laser pulses is kept constant by adjusting the intervals between successive said laser pulses according to the moving speed of said workpiece, the method further comprising increasing the pulse widths of the laser pulses in accordance with the decrease in moving speed of the X-Y table in the portion where the moving speed of the X-Y table is decreased.

It has been found out that this method can prevent the imperfect machining. The reason for this may be as follows: when not only the pulse interval but also the pulse width is increased in accordance with the decrease in speed of the X-Y table, the energy that diffuses from the irradiated portion during the widened pulse interval is compensated, whereby the temperature decrease can be prevented.

Thus, the problem in the machining of the portion where the speed of the X-Y table is decreased can be solved.

DETAILED DESCRIPTION

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1A:
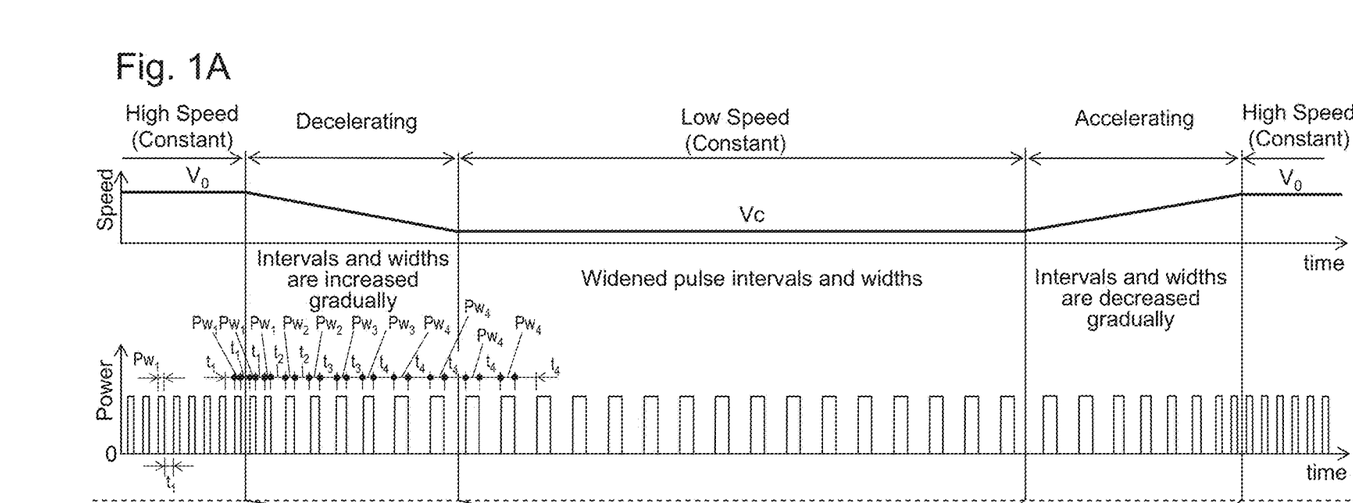
FIG. 1A is a conceptual timing diagram showing a relationship between a laser pulse train (in the lower part) and a speed change of the X-Y table (in the upper part) according to the present invention and FIG. 1B is a schematic diagram of a locus of laser spots in accordance with the laser pulses described in FIG. 1A.
Figure 1B:
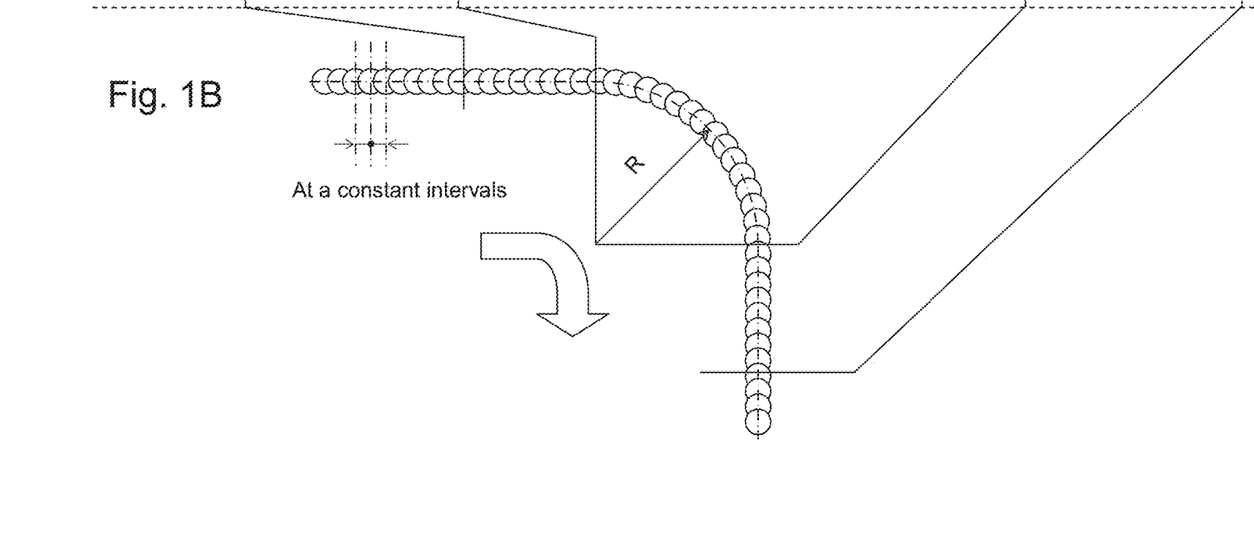
Figure 2:
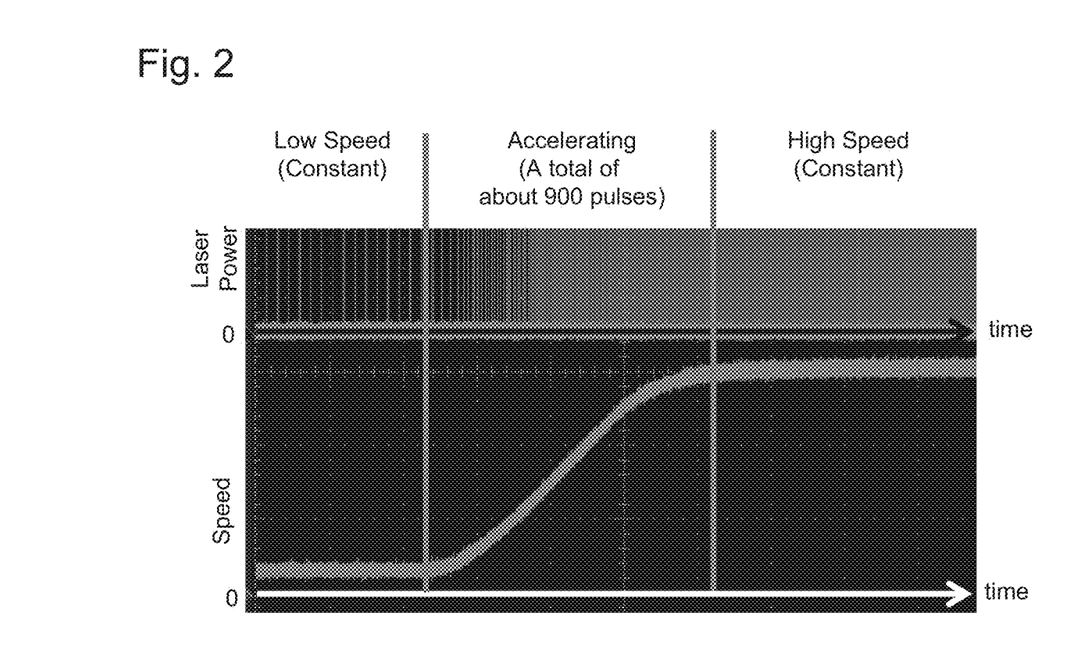
FIG. 2 is a photograph of a relationship between an actual laser pulse train and an actual X-Y table speed change as functions of time according to the present invention.

A machining method according to an embodiment of the present invention is described with reference to the drawings. FIG. 1A is a conceptual timing diagram showing a relationship between a laser pulse train and a speed change of the X-Y table according to the present invention, and FIG. 1B is a schematic diagram of a locus of laser spots in accordance with the laser pulses in the laser pulse train described in FIG. 1A. FIG. 2 is a photograph of a relationship between an actual laser pulse train and an actual X-Y table speed change as functions of time. Along the straight line 63 of the workpiece 6 illustrated in FIG. 8, the X-Y table 7 in FIG. 7 is driven at a constant high speed $V_0$, and the pitch of laser spots irradiated with the laser pulses on the workpiece 6 are constant. Where, the laser pulse width is represented by $Pw_1$ and the pulse interval is represented by $t_1$, and both are constant through the High-Speed period. When the laser spot gets closer to the corner 64 and the X-Y table 7 is decelerated, in order to make the laser spots have the same pitch as in the straight line 63 and to prevent the above mentioned imperfect machining, it has turned out to be effective that not only the laser pulse intervals are increased gradually, in such manner as $t_1 < t_2 < t_3 < t_4$ in gradual steps, but also the pulse widths are increased gradually, in such manner as $Pw_1 < Pw_2 < P_3 < Pw_4$ in gradual steps (Decelerating period). Where the pulses are rectangular, the pulse heights are kept constant, and the bottom levels between the pulses are nearly zero. Along the corner 64, the X-Y table 7 is driven at a constant low speed $V_c$ (Low Speed period). With the laser spot with the widened pulse interval ($t_4$) and pulse width ($Pw_4$), the pitch along the corner 64 is kept the same pitch as the pitch along the straight line and the imperfect machining can be prevented. After the corner 64, the X-Y table 7 is accelerated (Accelerating period). In the Accelerating period, in order to make the laser spots have the same pitch as in the straight line 63 and to prevent the imperfect machining, not only the laser pulse intervals are gradually decreased, in such manner as $t_4 < t_3 < t_2 < t_1$ in gradual steps, but also the pulse widths are gradually decreased, in such manner as $Pw_4 < Pw_3 < P_2 < Pw_1$, which is the opposite to the case of the deceleration. Then, the driving speed of the X-Y table 7 is returned to the high speed $V_0$. Here, the laser pulse intervals are automatically determined based on the speed of the X-Y table and the pitch of the laser spots.

FIG. 1B conceptually illustrates a small number of pulses. In fact, the number of pulses is approximately 900 pulses in the Accelerating or Decelerating period as shown in FIG. 2. The pulse widths are changed stepwise. These stepwise pulse widths are empirically determined beforehand.

Figure 3:
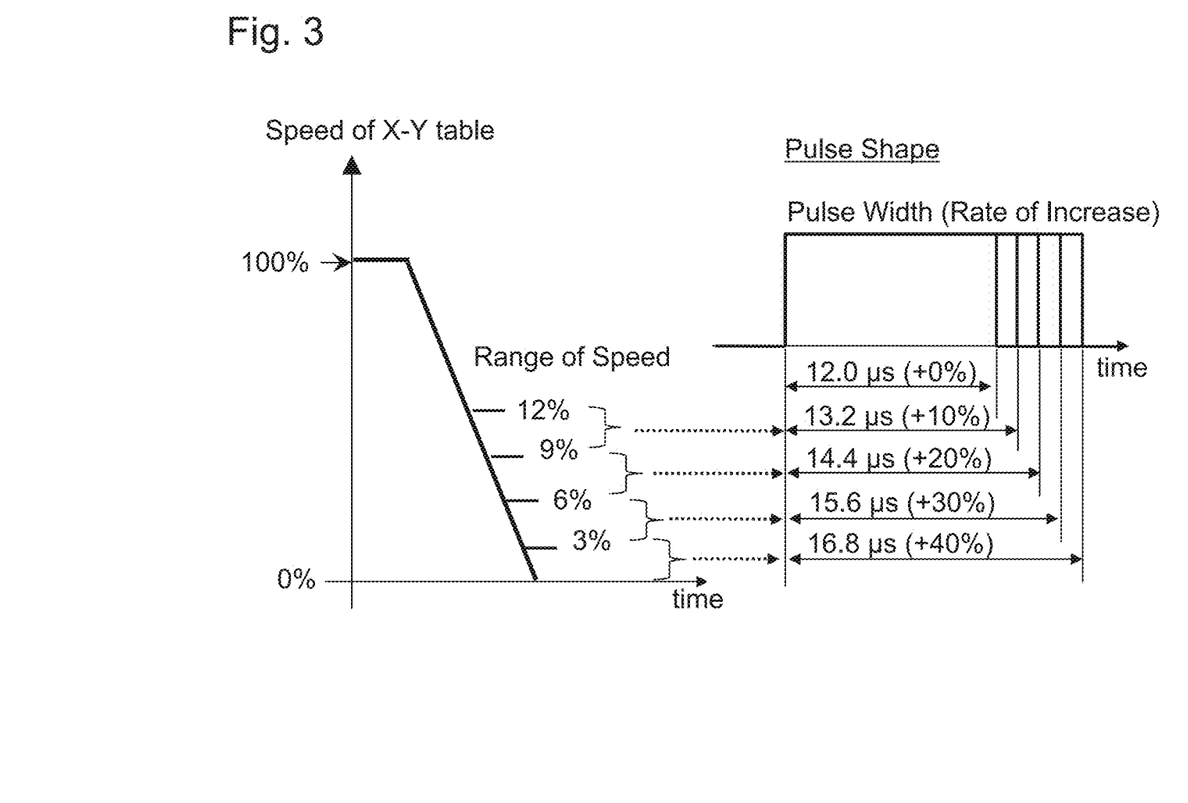
FIG. 3 illustrates an example of setting the pulse widths according to the present invention.

FIG. 3 illustrates an example of setting the pulse widths. When the high speed ($V_0$) of the X-Y table 7 is set to 100%, the speed range of the X-Y table 7 is divided into regions: less than 12% and 9% or more, less than 9% and 6% or more, less than 6% and 3% or more, and less than 3%. The pulse widths are discretely increased by 10%, 20%, 30%, and 40% in the respective regions. It has also turned out that it is effective when the pulse widths are increased in the portion where the speed of the K-Y table 7 is low (in specifically, 60% or less) as illustrated in the setting of this drawing. In this example, the setting is made stepwise (eight regions at maximum in this apparatus). However, the pulse width may be changed continuously since the apparatus used in this embodiment of the present invention obtains the laser pulses by modulating the CW laser beam using an AOM, and so pulse widths can be obtained freely.

Here, the application of the method according to an embodiment of the present invention is not limited to the case in which a resin film of a workpiece, which is a substrate 61 with a resin film 62 adhered thereto, is cut along the outline of the substrate 61. This method is applicable to cutting or cutting grooves that is performed along a locus alternately including straight lines and curved portions with respect to the workpiece 6. In this cutting or cutting grooves, the pulse interval is adjusted so that when the X-Y table 7 is moved at a high speed during the machining for the straight lines of the workpiece and at a low speed during the machining for the curved portions of the workpiece, when the X-Y table 7 stops even on a straight line, or when the moving speed of the X-Y table 7 is decreased during the deceleration, more generally, a locus includes portions where the moving speed of the X-Y table 7 is decreased, the pulsed laser spots are irradiated along this locus and at a constant pitch. The curved portion is not limited to the arc and may be a general curved track that causes the X-Y table to move at a low speed. The modulator may be a modulator that can slice a CW laser beam at a high speed. The modulator is not limited to the AOM described in this embodiment and may be an electro-optic modulator (EOM) or the like.

Example

Figure 4:
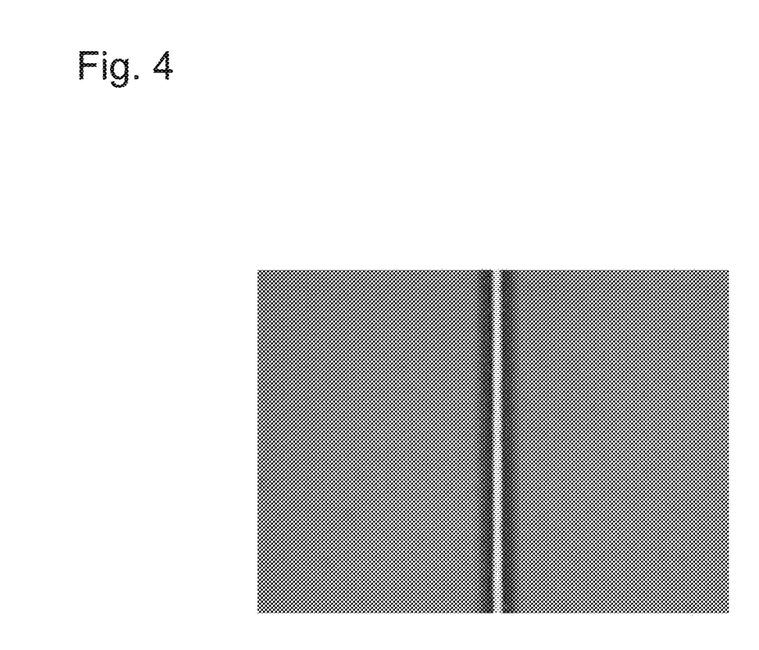
FIG. 4 is a photograph of a machined straight line according to the present invention.
Figure 5:
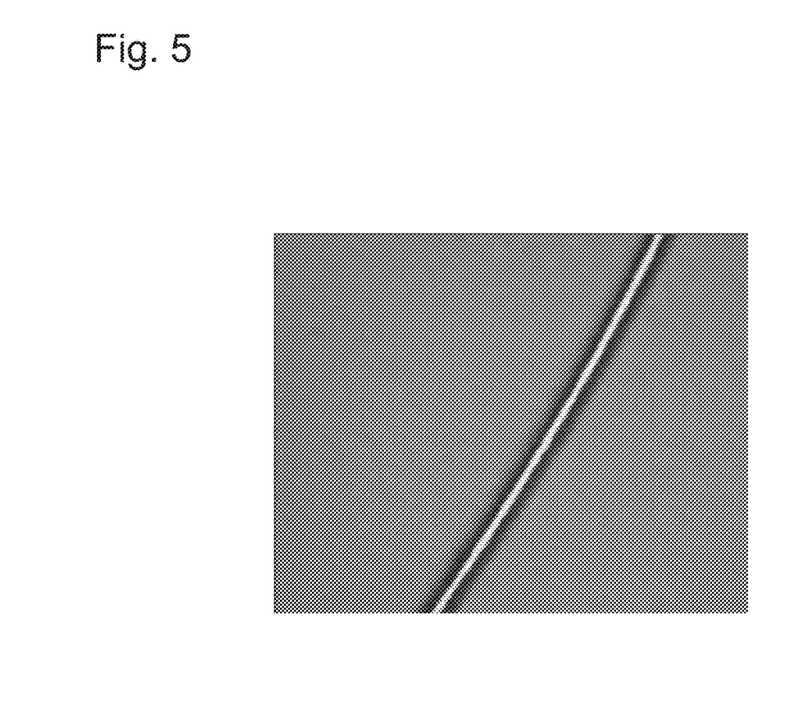
FIG. 5 is a photograph of a machined corner according to the present invention.

FIG. 4 and FIG. 5 show examples of a machining by the above described method. FIG. 4 shows an example of machining a straight line 63 and FIG. 5 shows an example of machining a corner 64. The substrate 61 was a glass substrate, and the resin film 62 was a polyethylene terephthalate (PET) film. The laser output was 8.0 W and the laser spot pitch was 25 μm. The speed of the X-Y table was 30 m/min in the straight line and 2 m/min in the corner. The number of laser shots for each spot was seven. As shown in FIGS. 4 and 5, it is understood that not just the straight line 63 but also the corner 64 is sufficiently machined.

The setting of the pulse widths were determined by a preliminary experiment as FIG. 3. Since the speed of the X-Y table 7 was 2/30=0.067 (6.7%), the pulse width in the corner portion 64 was 14.4 μs, which is 20% larger than that of the straight line.

Comparative Example

Figure 6:
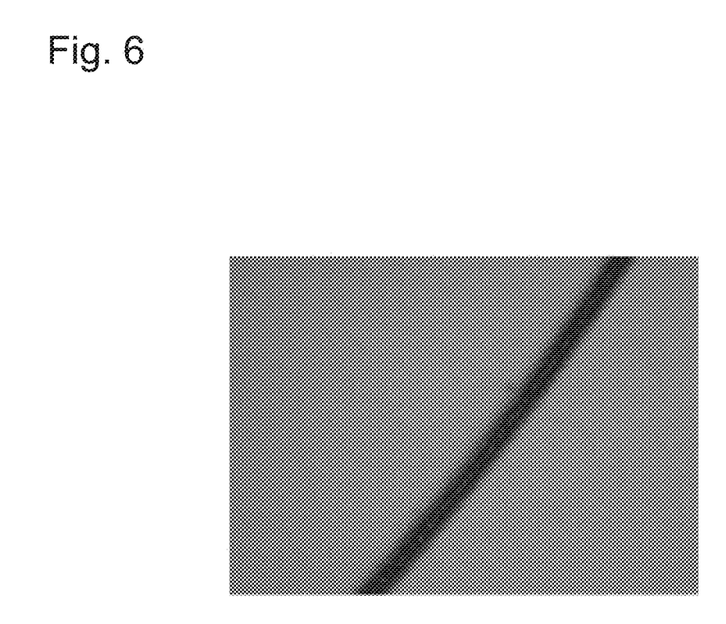
FIG. 6 is a photograph of a conventionally machined corner.

FIG. 6 is a photograph representing the state of a machined corner portion 64 obtained by a conventional method (FIG. 9A and FIG. 9B) in which the pulse width was constant (12.0 μs). As the machined groove of the corner 64 is black, it indicates that unprocessed resin with a carbonized surface remains and so the machining is insufficient.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A laser machining method for cutting or cutting grooves on a workpiece mounted on an X-Y table movable in X and Y directions by irradiating laser pulses on the workpiece, the method comprising:
    adjusting an interval between successive said laser pulses so that a pitch of holes machined with said laser pulses is kept constant even if a moving speed of said X-Y table changes,
    concurrently increasing stepwise the pulse widths of said laser pulses and a pulse interval between said laser pulses while keeping a height of said laser pulses constant in accordance with a decrease in said moving speed of said X-Y table when the moving speed decreases, and
    concurrently decreasing stepwise the pulse widths of said laser pulses and the pulse interval between said laser pulses while keeping the height of said laser pulses constant in accordance with an increase in moving speed of said X-Y table when the moving speed increases.

* * * * *